(12) United States Patent
Pei

(10) Patent No.: US 9,090,963 B2
(45) Date of Patent: Jul. 28, 2015

(54) ADJUSTABLE MASK FOR USE IN OPTICAL COATING PROCESS

(75) Inventor: Shao-Kai Pei, New Taipei (TW)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 384 days.

(21) Appl. No.: 13/527,854

(22) Filed: Jun. 20, 2012

(65) Prior Publication Data

US 2013/0228121 A1    Sep. 5, 2013

(30) Foreign Application Priority Data

Mar. 1, 2012    (TW) .................................. 101106822

(51) Int. Cl.
| C23C 16/00 | (2006.01) |
| C23C 16/50 | (2006.01) |
| C23F 1/00 | (2006.01) |
| H01L 21/306 | (2006.01) |
| C23C 14/04 | (2006.01) |

(52) U.S. Cl.
CPC .................................. *C23C 14/042* (2013.01)

(58) Field of Classification Search
CPC ...................................................... C23C 14/044
USPC .......... 118/720, 721, 504; 156/345.1, 345.11, 156/345.19, 345.3
See application file for complete search history.

(56) References Cited

U.S. PATENT DOCUMENTS

2009/0090301 A1*    4/2009    Tso et al. ...................... 118/715

* cited by examiner

*Primary Examiner* — Maureen Gramaglia
*Assistant Examiner* — Tiffany Nuckols
(74) *Attorney, Agent, or Firm* — Novak Druce Connolly Bove + Quigg LLP

(57) ABSTRACT

A mask for use in an optical evaporation coating includes a main shaft, a number of horizontal rods, a number of pairs of shielding sheets, and a number of adjustment members. The horizontal rods are vertically fixed on the main shaft, and each horizontal has a scale thereon. A pair of shielding sheets is connected to the two ends of each horizontal rod, and can slide along the horizontal rod. The shape of the mask can be accurately adjusted using the adjustment members to ensure masks covered with aluminum foil by different workers have the same shape.

4 Claims, 4 Drawing Sheets

ADJUSTABLE MASK FOR USE IN OPTICAL COATING PROCESS

BACKGROUND

1. Technical Field

The present disclosure relates to optical coating devices, and more specifically, to an adjustable mask for use in an optical coating process.

2. Description of Related Art

At present, optical film can be coated on surfaces of optical components through physical vapor deposition (PVD). Optical coating devices often include a vacuum room, an evaporation source, a substrate carrier arranged above the evaporation source, and a mask between the evaporation source and the substrate carrier. The mask is used for adjusting the thickness of the film deposited on the surface of the substrates on the different locations of the substrate carrier. For example, if the film on the surface of substrates on the outer portions of the substrate carrier is thicker than preset thickness, an aluminum foil can be used to extend the mask corresponding to the outer portions to shield the evaporation source more, such that less evaporation material will reach the outer portions. Although conventional masks can satisfy basic requirements, a new adjustable mask is still required.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments of the present disclosure will now be described in detail with reference to the accompanying drawings.

Figure 1:
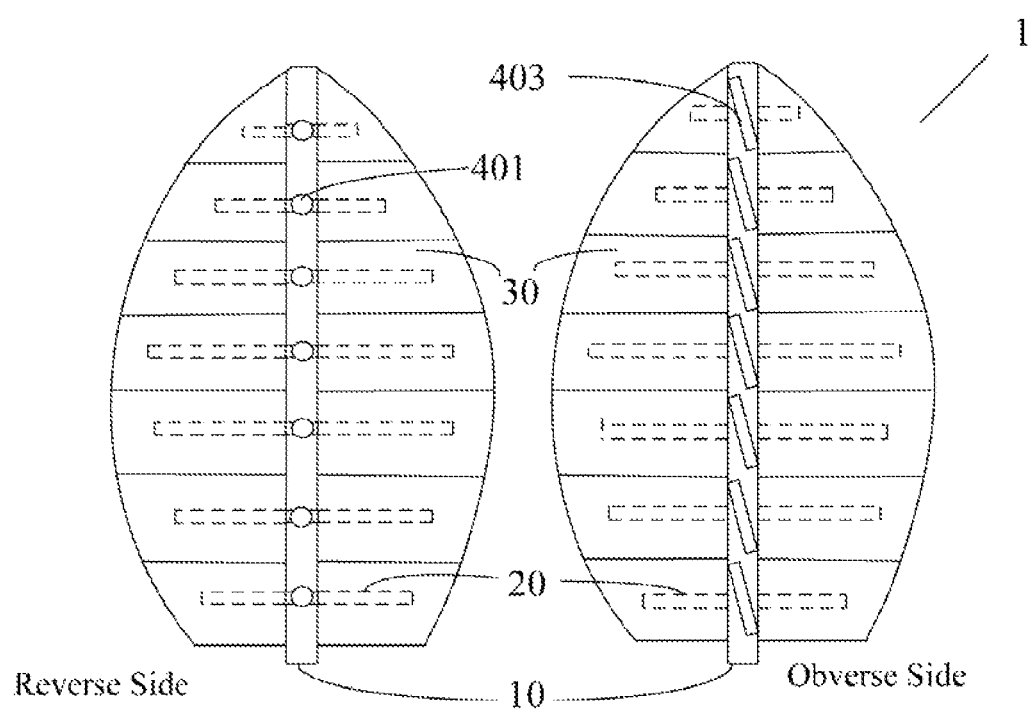
FIG. 1 is schematic view showing obverse and reverse sides of a mask in accordance with an exemplary embodiment.

Referring to FIG. 1, a mask 1 for use in a PVD process includes a main shaft 10, a number of horizontal rods 20, a number of pairs of shielding sheets 30, and a number of adjustment members 40. Each horizontal rod 20 is perpendicularly fixed to the main shaft 10 at the middle point of the horizontal rod 20. Each pair of shielding sheets 30 are slidably connected to one rod 20, and are symmetrically arranged with respect to the shaft 10, wherein the shielding sheets 30 belong to one pair have a same shape.

Figure 2:
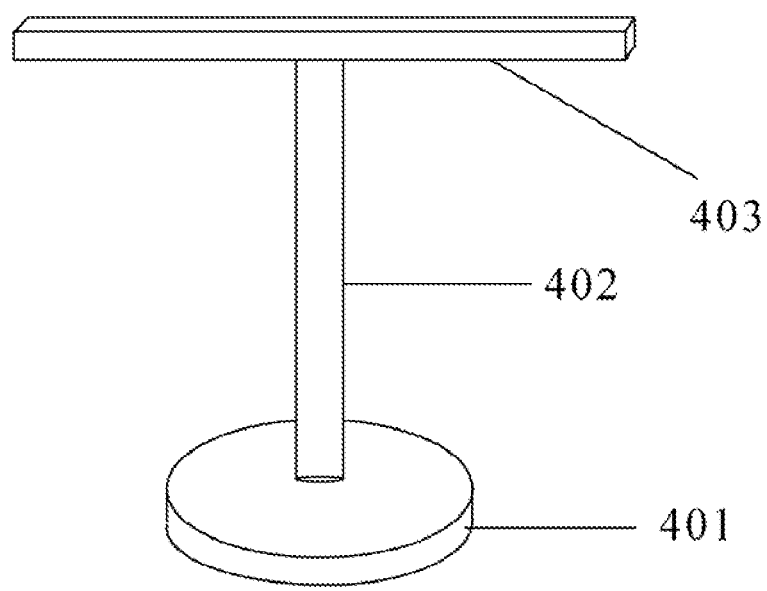
FIG. 2 is an isometric schematic view of an adjustment member of the mask of FIG. 1.

Referring to FIG. 2, each adjustment member 40 includes a round handle 401, a stem 402 protruding from the round handle 401, and a head portion 403 that is formed at the end of the stem 402 and substantially perpendicular to the stem 402. The stem 402 intersects with and passes through the main shaft 10 and can rotate with respect to the main shaft 10. The round handle 401 and the head portion 403 are located at opposite sides of the shielding sheets 30. The head portion 403 is arranged between each pair of shielding sheets 30. The round handle 401 is operable to rotate the stem 402 relative to the main shaft 10 such that the round handle 401 rotates to drive the one pair of shielding sheets 30 to slide along a corresponding one of the horizontal rods 20.

In the embodiment, there are seven horizontal rods 20, seven pairs of shielding sheets 30, and seven adjustment members 40. However, the number of the above elements is not limited and may be varied according to need.

Figure 3:
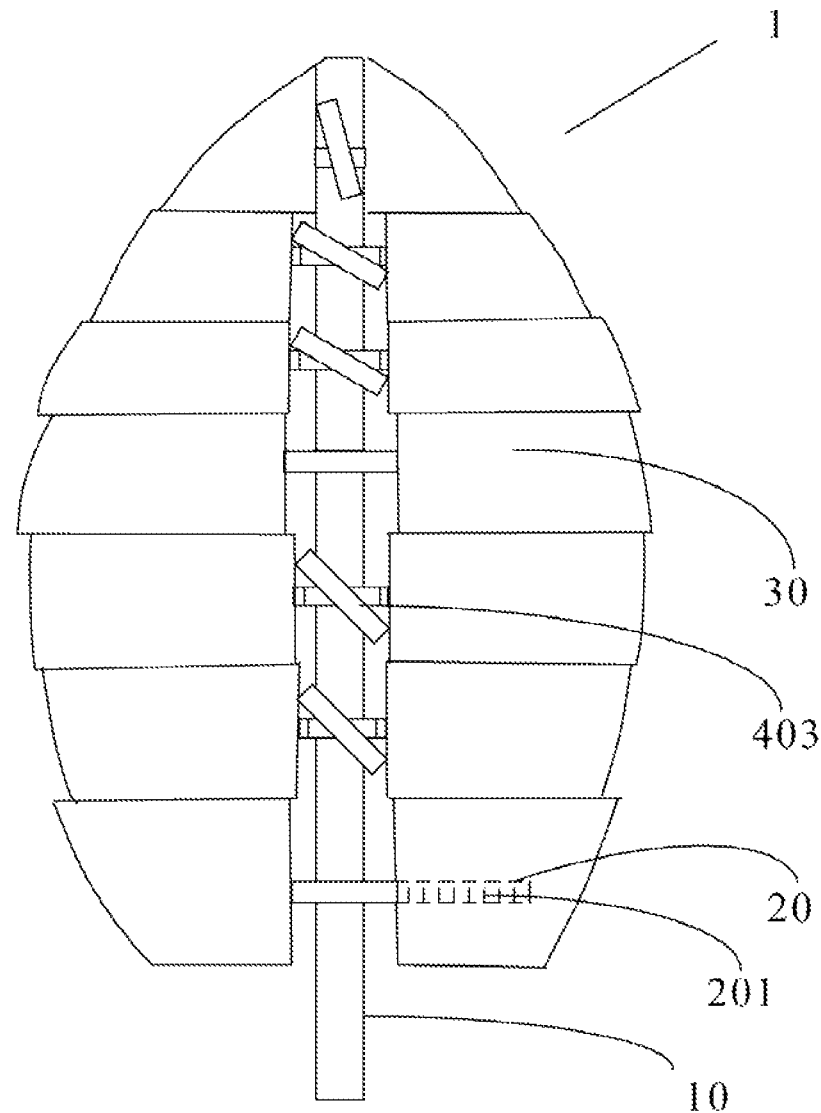
FIG. 3 is a schematic view of some shielding sheets of the mask of FIG. 1 in an adjusted state.

Referring to FIG. 3, a user can adjust the shape of the mask 1 by operating the adjustment member 40 when needed. Specifically, when a user turns the round handle 401, the head portion 403 rotates with the round handle 401, causing the head portion 403 to push the corresponding sheets 30 to move apart from each other along the corresponding horizontal rod 20. In the embodiment, each horizontal rod 20 has a scale 201, facilitating a user to accurately drive the shielding sheets 30 to a desired position. After each shielding sheet 30 is moved to a desired position, the adjusted mask 1 is then covered with aluminum foil.

Figure 4:
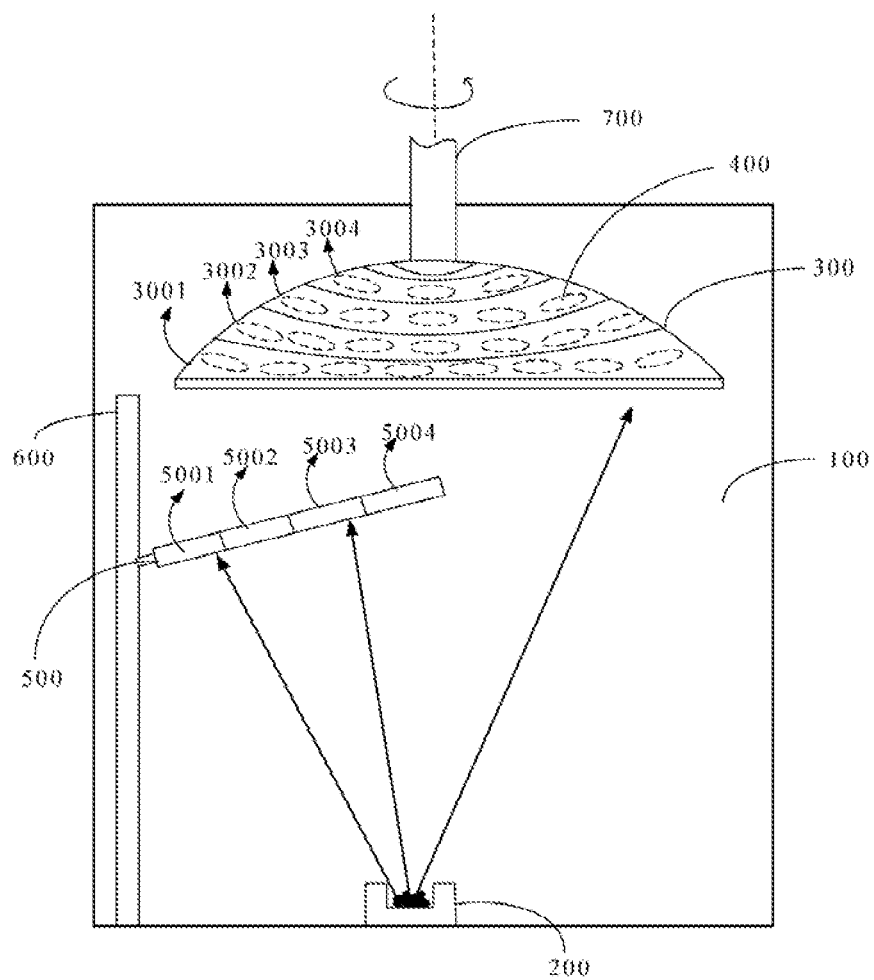
FIG. 4 is a schematic diagram of an optical coating device in accordance with an exemplary embodiment.

FIG. 4 shows a schematic diagram of an optical coating device in accordance with an exemplary embodiment. The optical coating device 11 includes a vacuum coating room 100, an evaporation source 200, a substrates carrier 300, a mask 500, a support 600, and a driving device 700. In the substrates carrier 300, there are four concentric ring areas 3001, 3002, 3003, and 3004 where substrates 400 are arranged. In the embodiment, the mask 500 is similar to the mask 1 in FIG. 1 except that the number of shielding sheets of the mask 500 is different from that of the mask 1. The mask 500 is fixed to the support 600, and includes four pairs of shielding sheets 5001, 5002, 5003, and 5004 that correspond to the four concentric ring areas 3001, 3002, 3003, and 3004 in the substrates carrier 300, wherein the pair of the sheets 5001 corresponds to the ring area 3001, and so on.

Before coating, the substrates 400 are first arranged on the substrates carrier 300, and the substrates carrier 300 is then fixed to the drive device 700 at the ceiling of the vacuum coating room 100. The adjusted and covered mask 500 is then connected to the support 600 and arranged between the evaporation source 200 and the substrates carrier 300. During coating, the drive device 700 drives the substrates carrier 300 to rotate at a certain speed, the film material in the evaporation source 200 is heated to evaporate up to the substrates 400 in the substrates carrier 300 and deposit on surfaces of the substrates 400 and form a film. The thickness of the film is monitored until reaching a preset value. Then the coating process is stopped.

While various embodiments have been described and illustrated, the disclosure is not to be construed as being limited thereto. Various modifications can be made to the embodiments by those skilled in the art without departing from the true spirit and scope of the invention as defined by the appended claims.

What is claimed is:

1. A mask for use in an optical evaporation coating to adjust the film thickness on the surface of the substrates , the mask comprising:

a main shaft;

a plurality of horizontal rods perpendicularly fixed to the main shaft;

a plurality of pairs of shielding sheets slidably connected to the horizontal rods; and a plurality of adjustment members, wherein each adjustment member comprises a handle, a stem and a head portion, the stem protrudes from the handle and intersects with and passes through the main shaft, the head portion is formed at an end of the stem and substantially perpendicular to the stem and set between one of the pairs of shielding sheets; the handle is operable to rotate the stem relative to the main shaft such that the handle rotates to drive the one pair of shielding sheets to slide along a corresponding one of the horizontal rods synchronously.

2. The mask for use in an optical evaporation coating according to claim 1, wherein each horizontal rod has a scale thereon.

3. The mask for use in an optical evaporation coating according to claim 1, wherein the number of the pairs of the shielding sheets corresponds to the number of ring areas in a substrate carrier where substrates are arranged.

4. The mask for use in an optical evaporation coating according to claim 3, wherein the two shielding sheets belong to one pair have a same shape.

\* \* \* \* \*